United States Patent [19]
McClure

[11] Patent Number: 5,703,512
[45] Date of Patent: Dec. 30, 1997

[54] METHOD AND APPARATUS FOR TEST MODE ENTRY DURING POWER UP

[75] Inventor: David C. McClure, Denton, Tex.

[73] Assignee: SGS-Thomson Microelectronics, Inc., Carrollton, Tex.

[21] Appl. No.: 712,960

[22] Filed: Sep. 12, 1996

Related U.S. Application Data

[63] Continuation of Ser. No. 466,107, Jun. 6, 1995, abandoned.

[51] Int. Cl.$^6$ .................................................. H03K 17/22
[52] U.S. Cl. ............................................. 327/198; 327/143
[58] Field of Search .................................. 327/31, 74, 76, 327/77, 78, 80, 81, 82, 143, 198, 205; 325/16, 31, 33, 41, 47

[56] References Cited

U.S. PATENT DOCUMENTS

| | | | |
|---|---|---|---|
| 4,716,322 | 12/1987 | D'Arrigo et al. | 327/143 |
| 4,886,984 | 12/1989 | Nakaoka | 327/143 |
| 5,159,206 | 10/1992 | Tsay et al. | 327/143 |
| 5,469,099 | 11/1995 | Konishi | 327/198 |

FOREIGN PATENT DOCUMENTS 5-22100  11/1991  Japan ................................. 327/143

*Primary Examiner*—Timothy P. Callahan
*Assistant Examiner*—My-Trang Nu Ton
*Attorney, Agent, or Firm*—Richard A. Bachand; Theodore E. Galanthay; Lisa K. Jorgenson

[57] ABSTRACT

An integrated circuit includes test circuitry and test mode enable circuitry. During power-up, an over-voltage on a package pin of the integrated circuit can initiate a test mode. The test mode enable signal may be latched into its activity state by a signal provided on a second package pin. Thereafter, the first and second package pins may be used in the normal voltage range during the test operations.

28 Claims, 2 Drawing Sheets

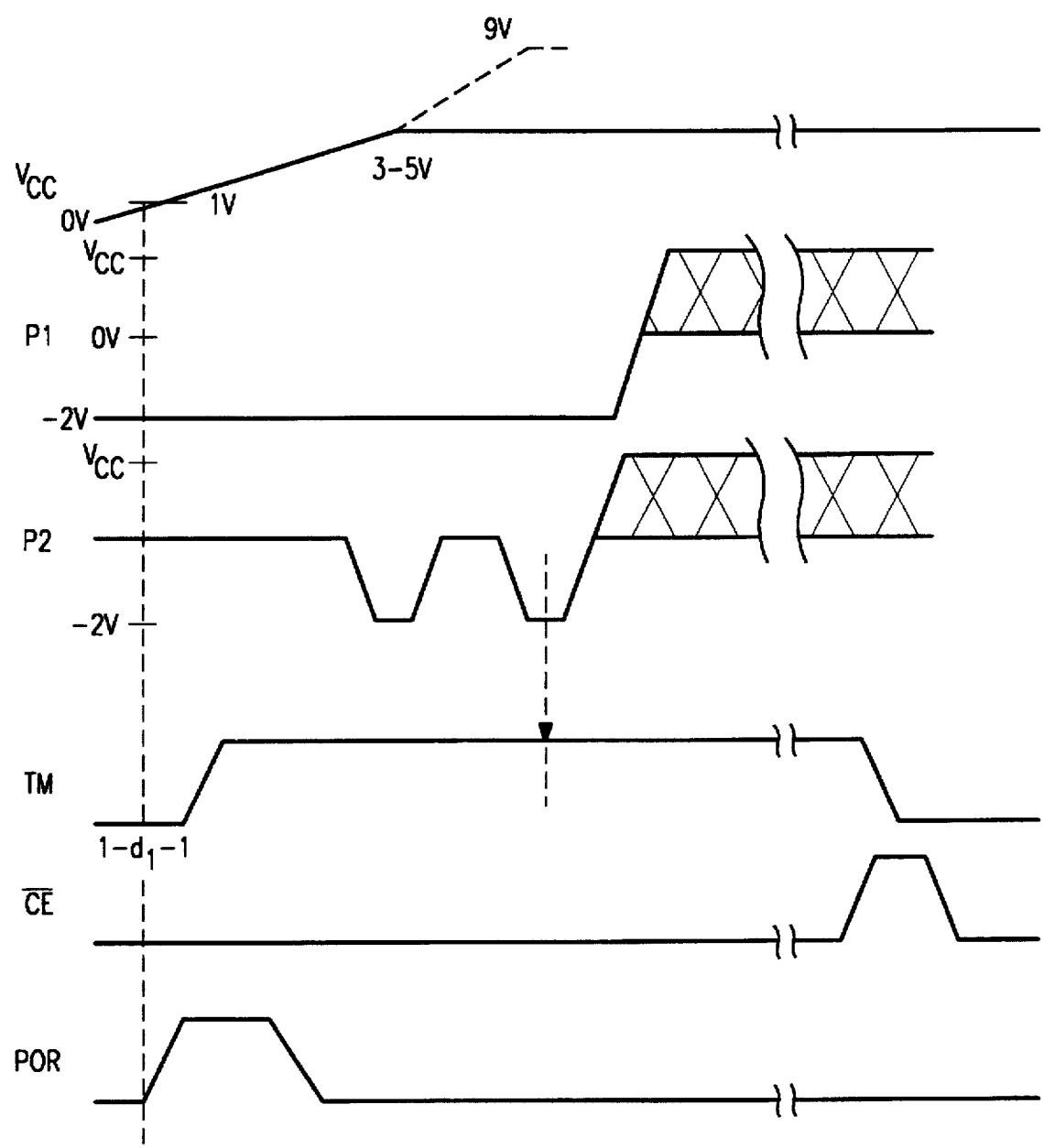

METHOD AND APPARATUS FOR TEST MODE ENTRY DURING POWER UP

This application is a continuation of application Ser. No. 08/466,107, filed Jun. 6, 1995 and now abandoned.

CROSS-REFERENCES TO RELATED APPLICATIONS

This application is related to co-pending U.S. application Ser. No. 08./172,854, filed Dec. 22, 1993 and entitled "Stress Test Mode", which is expressly incorporated by reference herein.

1. Technical Field of the Invention

The present invention relates in general to the testing of integrated circuits, and more particularly to the testing of integrated circuits where one or more tests may be initiated during power-up of the integrated circuit.

2. Background of the Invention

In order to ensure the reliability of their products, integrated circuit manufacturers perform testing to detect those parts which may fail in operation under specified operating conditions. Non-destructive testing of a part, however, may require many hours of testing, which can significantly add to the cost of the product.

Often, integrated circuits are tested both before and after packaging. Prior to packaging a part, testing can be performed through access to test pads designed into the integrated circuits specifically for testing. Once the integrated circuit is packaged, however, these test pads are no longer available and testing must be performed through the device pins. While pins can be dedicated on an integrated circuit for testing, many integrated circuits products are pin-limited and, therefore, pins which have one function during normal operation of the circuit are used for another function while the integrated circuit is in test mode. One system for testing a packaged integrated circuit is described in U.S. Pat. No. 5,072,137 to Slemmer, entitled "Semiconductor Memory With a Clocked Access Code for Test Mode Entry," issued Dec. 10, 1991, which is incorporated by reference herein.

In order to reduce the time for rigorous testing of an integrated circuit, testing is often performed at "super-voltages", which will cause marginal parts to fail more quickly. For example, testing on a five-volt part may be performed at 9-volts. One such test (for an unpackaged memory cell) is described in U.S. application Ser. No. 08/172,854, referenced above, in which multiple memory cells are tested in parallel by applying super-voltages to multiple word lines and columns. However, applying a super-voltage to multiple word lines and columns simultaneously as a test mode is entered may result in a large current surge within the integrated circuit which can damage the device.

Therefore, a need has arisen for a test mode entry circuit which allows entry into test mode at low voltages to avoid high current transients, without affecting the test performed at normal or super-voltages without adding DC voltage paths.

SUMMARY OF THE INVENTION

The present invention provides circuitry for initiating a special operating mode, such as a test mode, in an integrated circuit. Special mode circuitry is provided for operating the integrated circuit in the special mode responsive to a first signal. A voltage is applied to a first package pin during transition of the integrated circuit from an unpowered state to a powered state, such that a first predetermining voltage level between the first package pin and a first internal node is exceeded. Responsive to this voltage, a first signal is placed in a first state, signalling the initiation on the special operating mode. A signal is placed on the second package pin to latch the first signal in said first state, such that said first and second package pins can be used thereafter in a normal operating range.

The present invention provides significant advantages over the prior art. Importantly, an integrated circuit can enter a test mode during power-up of the chip, and the pins used to initiate test mode can be used for other purposes once a predetermined voltage is reached. The initiation of the test mode during power up can eliminate current transients which can be damaging to the integrated circuit. Further, the preferred embodiment eliminates DC current paths between $V_{CC}$ and $V_{SS}$, which can affect the efficiency of the test.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a timing diagram showing signals from the schematic of FIG. 2.

DETAILED DESCRIPTION OF THE PREFERRED EMBODIMENTS

Figure 1:
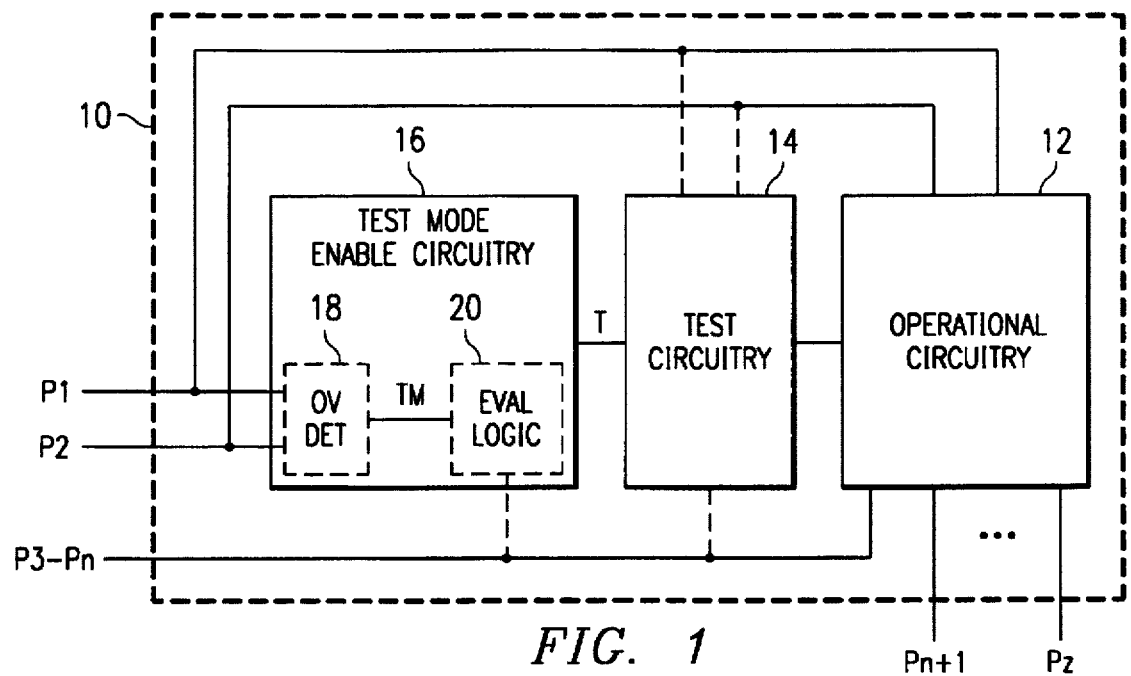
FIG. 1 illustrates a block diagram of an integrated circuit incorporating the present invention.
Figure 2:
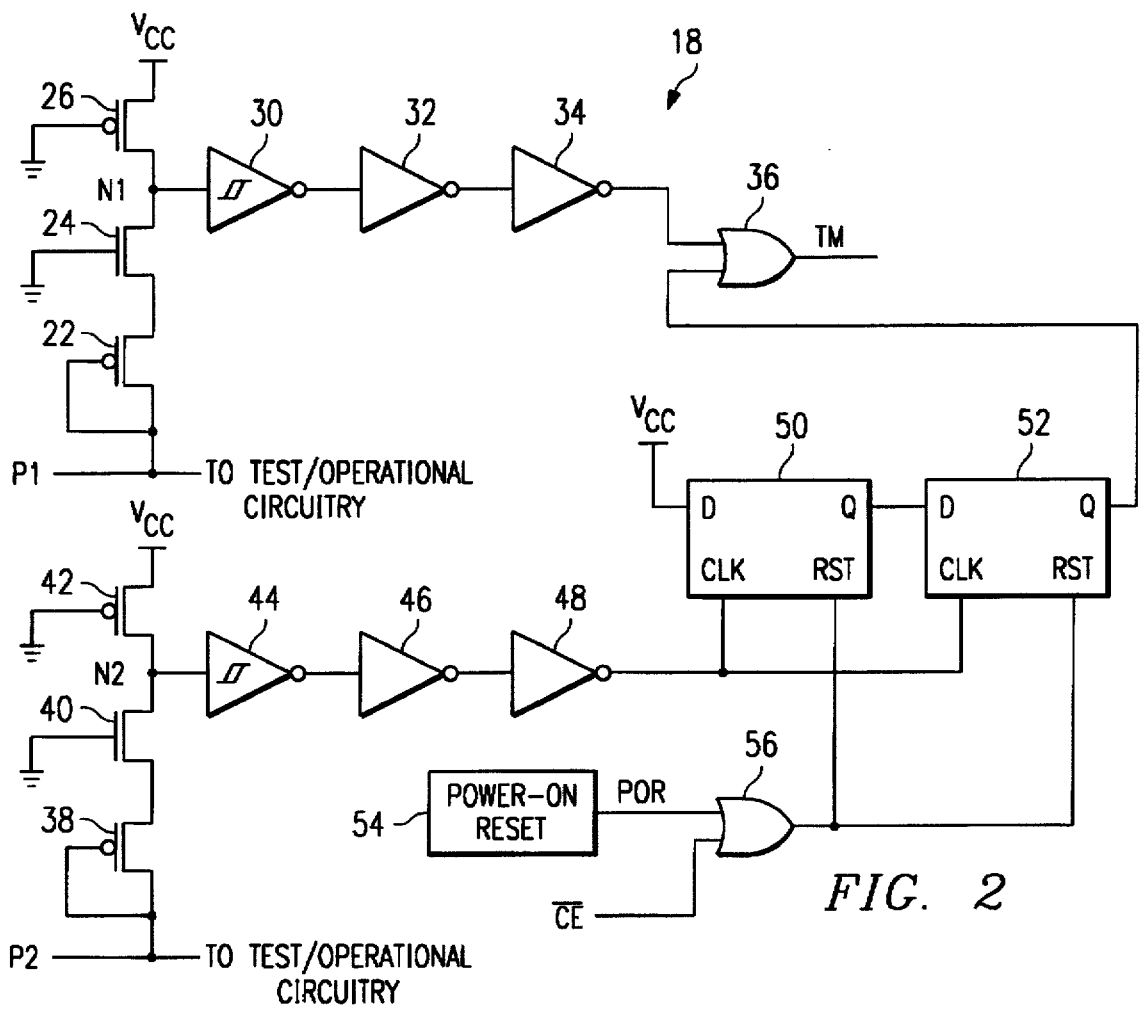
FIG. 2 illustrates a schematic representation of the over-voltage detection circuitry of FIG. 1.

The preferred embodiment of the present invention and its advantages are best understood by referring to FIGS. 1–3 of the drawings, like numerals being used for like and corresponding parts of the various drawings.

FIG. 1 illustrates a block diagram of an integrated circuit having test circuitry which can be enabled during power-up of the integrated circuit. The integrated circuit 10 comprises operational circuitry 12, coupled to test circuitry 14, which is controlled by test mode enable circuitry 16. Test mode enable circuitry 16 includes over-voltage detect circuitry 18 and evaluation logic 20. Pins P1 ... Pz provide external connects to the integrated circuit 10. P1 and P2 are connected to the over-voltage detect circuitry 18 and to operational circuitry 12. P1 and P2 may also be coupled to test circuitry 14. Pins P3 ... Pn are coupled to the operational circuitry and, optionally, to the evaluation logic circuitry 20 and test circuitry 14. The remainder of the pins, Pn+1 ... Pz are coupled to the operational circuitry 12.

It should be noted that the numerical ordering of the pins P1 ... Pz is for purposes of illustration; the designations P1, P2, and so on, do not designate any particular physical pin on a device. Further, it should be noted that while the present invention is described in the context of initiating test circuitry, it could be used to initiate any circuit or mode which may need to be initiated during power-up.

Under normal operating conditions, the operational circuitry 12 performs the normal function of the integrated circuit, receiving and generating signals on pins P1 ... Pz. When signal TM is in an active state (for illustration purposes, TM is active when it is at a logically high voltage), the evaluation circuitry 20 generates a signal T responsive to the signals on pins P3–Pn. T specifies a test to be performed by test circuitry 14. Thus, by applying desired signals to pins P3–Pn, one of $2^{n-2}$ test modes may be selected. If only a single test mode is implemented in the integrated circuit 10, the evaluation logic 20 is not necessary, and signal TM could be used to initiate the test circuitry. The test mode is exited by applying an appropriate chip-enable signal to the overload detection circuitry, for example, by applying a logical high signal to the $\overline{CE}$ (chip enable), shown in FIG. 2, or from a power-on reset circuit 54 (described in greater detail in connection with FIG. 2).

The over-voltage detect circuitry 18 can initiate a test mode, such as a stress test mode, in test circuitry 14 through evaluation logic 20 during power-up of the integrated circuit 10. Initiating a test mode during power-up may be useful if entering the test mode while voltage sources at normal operating voltage may cause a power surge which could damage the integrated circuit 10. For example, U.S. application Ser. No. 08/172,854, referenced above, describes a stress test in which every row and column is enabled simultaneously during a certain test mode. The entry into the above mentioned test mode could result in high current causing significant damage to the device if entered at a normal operating voltage. However, if the test is entered during power-up, no logic switching takes place, because the device is being initiated in the test state with the rows and columns enabled.

FIG. 2 illustrates a schematic representation of a preferred embodiment the over-voltage detection circuit 18. The over-voltage detection circuitry can set signal TM to a logical high responsive to signals on P1 or P2. In the illustrated embodiment, the over-voltage detection circuit is responsive to voltages on P1 or P2 which are a certain value below ground ($V_{SS}$). It should be noted that in an alternative embodiment, a positive over-voltage condition (i.e., where the voltage at pins P1 or P2 exceed a certain value greater than the positive power supply voltage, or $V_{CC}$) could be used to generate a logical high on signal TM.

P1 is coupled to the gate and drain of P-channel transistor 22. The source of P-channel transistor 22 is coupled to the source of N-channel transistor 24. The gate of N-channel transistor 24 is coupled to ground. The drain of N-channel transistor 24 is coupled to the drain of P-channel transistor 26. The source of P-channel transistor 26 is coupled to $V_{CC}$ and the gate of P-channel transistor 26 is coupled to ground. The node (N1) coupling the drain of P-channel transistor 26 and the drain of N-channel transistor 24 is coupled to the input of a Schmitt trigger 30. The output of Schmitt trigger 30 is coupled to the input of inverter 32. The output of inverter 32 is coupled to the input of inverter 34. The output of inverter 34 is coupled to a first input of OR gate 36. The output of OR gate 36 is the TM signal. P2 is coupled to the drain and gate of P-channel transistor 38. The source of P-channel transistor 38 is coupled to the source of N-channel transistor 40. The gate of N-channel transistor 40 is coupled to ground and the drain of N-channel transistor 40 is coupled to the drain of P-channel transistor 42. The gate of P-channel transistor 42 is coupled to ground and the source of P-channel transistor 42 is coupled to $V_{CC}$. The node (N2) between the drain of N-channel transistor 40 and drain of P-channel transistor 42 is coupled to the input of Schmitt trigger 44. The output of Schmitt trigger 44 is coupled to the input of inverter 46. The output of inverter 46 is coupled to the input of inverter 48. The output of inverter 48 is coupled to the clock input of D flip-flops 50 and 52. The input to D flip-flop 50 is coupled to $V_{CC}$ and the non-inverting output of D flip-flop 50 is coupled to the input of D flip-flop 52. The non-inverting output of D flip-flop 52 is coupled to the second input of OR gate 36. A power-on reset circuit 54 has an output POR, which is coupled to the first input of OR gate 56. The chip-enable signal $\overline{CE}$ is coupled to the second input of OR gate 56. The output of OR gate 56 is coupled to the reset nodes of flip-flops 50 and 52.

In operation, P1 can be used to drive TM to a logical high during power-up (transition from a low power, or zero power, mode to an operational mode) of the integrated circuit 10. In the preferred embodiment, P-channel transistor 26 is a relatively small transistor relative to transistors 24 and 22 in terms of its width-to-length ratio (W/L). For example, the W/L of transistor 26, in this embodiment, is on the order of 1/250, while the W/L of transistors 24 and 22 are on the order of 2. Accordingly, when transistors 24 and 22 are in a conductive state, they will be capable of pulling down node N1, even though transistor 26 remains conductive. During normal power-up of the integrated circuit 10, as $V_{CC}$ rises to its predetermined voltage (for example, 5 volts), the voltage at N1 will similarly increase.

N1 is coupled to the input of a conventional Schmitt trigger circuit 30, which performs the logical inversion, with hysteresis in its transfer characteristic. Such hysteresis provides stability to over-voltage detection 18, such that small variations on the voltage of N1 will not cause the output of the Schmitt trigger to oscillate between high and low levels. As N1 increases with $V_{CC}$ during power-up, the output of Schmitt trigger 30 will output a logical low (once the voltage at N1 exceeds the trip-voltage, $V_{trip}$, of the Schmitt trigger 30), which will result in a logical low at the output of inverter 34. As will be described in greater detail hereinbelow, the output of flip-flop 52 will also be low during normal power-up of the integrated circuit 10, thereby resulting in a logical low at the output of OR gate 36.

A special test mode may be enabled by presenting a voltage on package pin P1, which is sufficiently below the voltage of $V_{CC}$ to cause N1 to be pulled low. The trip voltage level of Schmitt trigger 30 can be set such that the predetermined voltage on P1, such as −2 volts, will cause a voltage on N1 which is below the trip voltage, thereby causing the Schmitt trigger 30 to output a logical high voltage. In this instance, the output of inverter 34 will also be a logical high voltage, causing signal TM to a logical high state. As described above, when signal TM is in a logically high state, the evaluation logic outputs a signal T to test circuitry 14 to initiate the test mode.

P2 is used to lock TM at a logical high state so that P1 may be returned to a normal voltage (e.g., $V_{CC}$ or $V_{SS}$). Initially, upon power-up, the flip-flops 50 and 52 are reset by power-on reset circuitry 54. The function of power-on reset circuit 54 is to prevent inadvertent entry into a special test mode upon power-up of integrated circuit 10. Accordingly, at power-up, power-up reset circuit 54 will output a logical high POR signal, which causes a logical high on the output of OR gate 56. The logic high output of OR gate 56 causes flip-flops 50 and 52 to be reset. Once the integrated circuit reaches a predetermined voltage, such as 2 volts, the power-on reset circuitry 54 pulls the POR signal low. U.S. Pat. No. 5,072,137 describes a power-on reset circuit in greater detail.

After the integrated circuit 10 is powered up to a reasonable voltage (for example, once $V_{CC}$ reaches 3 to 5 volts), P2 is clocked low (for example, to −2 volts) twice. On the first clock, N2 is pulled below the trip voltage of Schmitt trigger 44, as described above, resulting in a logical high output of Schmitt trigger 44. The logical high output from Schmitt trigger 44 results in a logical high output from inverter 48, which causes $V_{CC}$ to be clocked into flip-flop 50. Consequently, the non-inverting output of flip-flop 50 is at a logical high state after the first low-going clock of P2. On the second low-going clock of P2, the logical high output of flip-flop 50 is clocked into flip-flop 52, resulting in a logical high state at the non-inverting output of flip-flop 52. At this point, both inputs to OR gate 36 are logical high voltages. Since the output of flip-flop 52 is holding signal TM at a logical high voltage, P1 and P2 may be used within their normal voltage range (i.e., between $V_{CC}$ and $V_{SS}$). Thus, P1 and P2 are free to be exercised in conjunction with the test mode without effecting signal TM.

In the illustrated embodiment, test mode may be exited by changing the state of the $\overline{CE}$ pin to a logical high, which will cause a reset of flip-flops 50 and 52. While $\overline{CE}$ is used in the illustrated embodiment, any pin which will not be exercised during the test mode may be used to perform the reset function.

It should be noted that after P1 and P2 have been returned to normal voltage levels, there is no DC current path associated with the over-voltage circuitry 18 which would pull down $V_{CC}$ or cause latch up at high $V_{CC}$ levels. This is important because accelerated testing may be performed with $V_{CC}$ set to a super-high voltages, such as 9 volts, and any DC current path may result in a reduced upper limit for $V_{CC}$. As described in U.S. application Ser. No. 08/172,854, referenced above, the higher voltage source level can be used to reduce testing time. The present invention also allows the test to be entered at power up to avoid high current transients.

FIG. 3 illustrates a timing diagram illustrating the operation of the present invention. On power-up, $V_{CC}$ gradually rises from 0 volts to a desired level, for example, 5 volts for normal operations and 9 volts for testing. With P1 held at a over-voltage of −2 volts, the Schmitt trigger will be tripped after $V_{CC}$ reaches approximately one volt. The signal from the output of Schmitt trigger will propagate to cause TM to transition to a logical high after a delay, $d_1$, caused by logic 32, 34 and 36. At approximately the same time, the POR signal goes high, resetting flip-flops 50 and 52 on its active-high edge. After $V_{CC}$ has reached a voltage in the range of 3 to 5 volts, P2 is clocked low twice, causing the logical high voltage to propagate through to the non-inverting output of flip-flop 52. At this point, P1 can return to a voltage in its normal operating without affecting the logical state of TM. At the end of the test period, $\overline{CE}$ is clocked high to reset flip-flops 50 and 52, causing TM to transition to a logical low voltage.

The present invention provides significant advantages over the prior art. First, the test mode can be enabled during power-up to eliminate problems associated with switching to test mode at normal voltage levels or super-voltage levels to reduce transient current surges. Secondly, the test mode may be maintained such that P1 and P2 may be used during test mode operations. Third, the present invention does not provide a DC current path, even while P1 and P2 are being exercised at normal operational voltage levels, which would inhibit the maximum voltage level at which the integrated circuit 10 could be tested. Fourth, the invention allows entry into test mode for a packaged device.

Although the present invention and its advantages have been described in detail, it should be understood that various changes, substitutions and alterations can be made herein without departing from the spirit and scope of the invention as defined by the appended claims.

What is claimed is:

1. In an integrated circuit (IC) having operational-circuitry and test-circuitry connected to said operational-circuitry, test-mode-enable circuitry for enabling said test-circuitry to operate during a time-interval of power-up of said IC from a power terminal that is connected to source of IC operating voltage, said power terminal initially having a potential of zero volts applied thereto as said power-up time-interval begins, thereafter having a first low voltage applied thereto, and then having a second higher voltage applied thereto, said test-circuitry being enabled upon receiving a test-mode signal, said test-mode-enable circuitry comprising:

a first terminal for receiving a first signal generally coincident with said beginning of said power-up time-interval;

a second terminal for receiving a second signal at a time during said power-up time-interval;

first-voltage-threshold-sensitive means responsive to an input of a first threshold level;

said first-voltage-threshold-sensitive means having an output connected to provide said test-mode signal to said test-circuitry, and having an input connected to receive a voltage difference between said first terminal and said power terminal;

said first-voltage-threshold-sensitive means operating to apply said test-mode signal to said testing-circuitry when said source of operating voltage equals said first low voltage;

signal-latching means having an input, and having an output operating to apply said test-mode signal to said testing-circuitry;

second-voltage-threshold-sensitive means;

said second-voltage-threshold means having an input connected to receive a voltage difference between said second terminal and said power terminal, and having an output connected to said input of said signal-latching means;

said second-voltage-threshold-sensitive means operating to control said signal-latching means to cause said signal-latching means to apply said test-mode signal to said testing-circuitry upon the occurrence of said second signal, and when said source of operating voltage equals said second higher voltage; and said test-mode signal being thereafter maintained independent of said first and second signals received respectively by said first and second terminals.

2. The integrated circuit of claim 1 wherein said IC is a packaged integrated circuit, wherein said first and second terminals and said power terminal are external IC package pins, and wherein first and second of said external IC package pins are connected to said operational-circuitry.

3. The integrated circuit of claim 1 wherein said test-mode-enable apparatus includes:

an IC-enable input connected to a second input of said signal-latching means;

said IC-enable input operating to terminate said test-mode signal.

4. The integrated circuit of claim 1:

wherein said first voltage-threshold-sensitive means comprises first transistor means connected between a first circuit-node and said power terminal, second transistor means connected between said first circuit-node and said first terminal, and a first Schmitt trigger having an input connected to said first circuit-node and having an output connected to apply said test-mode signal to said testing-circuitry; and wherein said second-voltage-threshold-sensitive means comprises third transistor means connected between a second circuit-node and said power terminal, fourth transistor means connected between said second circuit-node and said second terminal, a second Schmitt trigger having an input connected to said second circuit-node, and having an output connected to said input of said signal-latching means.

5. The integrated circuit of claim 4 wherein said test-mode-enable apparatus includes:

a chip-enable input connected to a second input of said signal-latching means;

said chip-enable input operating to terminate a second test-mode signal.

6. The integrated circuit of claim 5 wherein said test-mode-enable apparatus includes logical OR means receiving as inputs a first test-mode signal provided by said first voltage-sensitive-threshold means, and said second test-mode signal provided by said latching-means, said logical OR means having an output connected to said test-circuitry.

7. The integrated circuit of claim 6 wherein said IC is a packaged integrated circuit, wherein said first and second terminals and said power terminal are external IC package pins, and wherein first and second of said external IC package pins are connected to said operational-circuitry to enable use of said first and second external IC package pins to apply signals to said operational-circuitry after said signal-latching means operates to apply said test-mode signal to said testing-circuitry.

8. The integrated circuit of claim 1 wherein said signal-latching means comprises flip-flop means having an input connected to said output of said second voltage-sensitive-threshold means, and having an output connected to apply said test-mode signal to said testing-circuitry.

9. The integrated circuit of claim 8:

wherein said second signal received by said second terminal comprises a first and a second signal pulse;

wherein said flip-flop means comprises a first and second series connected flip-flops; and wherein an output of said second flip-flop is connected to apply said test-mode signal to said testing-circuitry.

10. The integrated circuit of claim 9 wherein said test-mode-enable apparatus includes:

a chip-enable input connected to said first and second flip-flops;

said chip-enable input operating to terminate said test-mode signal.

11. The integrated circuit of claim 10 wherein said IC is a packaged integrated circuit, wherein said first and second IC terminals and said power terminal are external IC package pins, and wherein first and second of said external IC package pins are connected to said operational-circuitry.

12. The integrated circuit of claim 11 wherein said test-mode-enable apparatus includes a logical OR gate receiving as inputs first and second test-mode signals generated respectively by said first voltage-sensitive-threshold means and said latching means, and providing an output to said test-circuitry.

13. In combination, operational-circuitry, test-circuitry connected to said operational-circuitry, and test-mode-enable circuitry for enabling said test-circuitry, by applying a test-mode signal to said test-circuitry, said test-mode-enable circuitry comprising:

a voltage source of a first polarity, said voltage source providing an output voltage that is initially zero volts at a beginning of a time-interval, said output voltage progressively increasing during said time-interval, first to a low voltage, and then to a high voltage;

a power terminal connected to said voltage source;

a first terminal for receiving a first signal of an opposite polarity generally coincident with said beginning of said time-interval;

a second terminal for receiving a second signal of said opposite polarity at a time within said time-interval at which said output voltage of said voltage source is generally equal to said high voltage;

first-voltage-threshold-sensitive means responsive to an input of a first threshold level;

said first-voltage-threshold-sensitive means having an output connected to provide said test-mode signal to said test-circuitry, and having an input connected to receive a voltage difference between said first terminal and said power terminal;

said first-voltage-threshold-sensitive means operating to apply said test-mode signal to said testing-circuitry when said output voltage of said voltage source generally equals said low voltage;

signal-latching means having an input, and having an output operating to apply said test-mode signal to said testing-circuitry;

second-voltage-threshold-sensitive means;

said second-voltage-threshold means having an input connected to receive a voltage difference between said second terminal and said power terminal, and having an output connected to said input of said signal-latching means; and said second-voltage-threshold-sensitive means operating to control said signal-latching means to cause said signal-latching means to apply said test-mode signal to said testing-circuitry upon the occurrence of said second signal.

14. The combination of claim 13 wherein said first and second terminals are connected to said operational-circuitry to thereby enable use of said first and second terminals to apply signals to said operational-circuitry after said signal-latching means operates to apply said test-mode signal to said testing-circuitry.

15. The combination of claim 13 wherein said test-mode-enable apparatus includes:

an enable input connected to a second input of said signal-latching means;

said enable input operating to terminate said test-mode signal.

16. The combination of claim 13:

wherein said first voltage-threshold-sensitive means comprises first transistor means connected between a first circuit-node and said power terminal, second transistor means connected between said first circuit-node and said first terminal, and a first Schmitt trigger having an input connected to said first circuit-node and an output connected to apply said test-mode signal to said testing-circuitry; and wherein said second-voltage-threshold-sensitive means comprises third transistor means connected between a second circuit-node and said power terminal, fourth transistor means connected between said second circuit-node and said second terminal, a second Schmitt trigger having an input connected to said second circuit-node, and having an output connected to said input of said signal-latching means.

17. The combination of claim 16 wherein said test-mode-enable apparatus includes:

an enable input connected to a second input of said signal-latching means;

said enable input operating to terminate a second test-mode signal.

18. The combination of claim 17 wherein said test-mode-enable apparatus includes logical OR means receiving as inputs a first test-mode signal generated by said first voltage-sensitive-threshold means, and said second test-mode signal provided by said latching-means, said logical OR means having an output connected to said test-circuitry.

19. The combination of claim 18 wherein said first and second terminals are connected to said operational-circuitry to enable use of said first and second terminals after said signal-latching means is controlled to apply said test-mode signal to said testing-circuitry.

20. The combination of claim 13 wherein said signal-latching means comprises flip-flop means having an input connected to said output of said second voltage-sensitive-threshold means, and having an output connected to apply said test-mode signal to said testing-circuitry.

21. In an integrated circuit (IC) having operational-circuitry and test-circuitry connected to said operational-circuitry, a method of enabling said test-circuitry to operate during a time-interval of power-up of said IC from a power terminal that is connected to source of operating voltage, said power terminal initially having a potential of zero volts applied thereto as said power-up time-interval begins, thereafter having a first low voltage applied thereto, and then having a second higher voltage applied thereto, said test-circuitry being enabled upon receiving a test-mode signal, said method comprising the steps of:

providing first terminal means for receiving a first signal at a time generally coincident with said beginning of said power-up time-interval;

providing second terminal means for receiving a second signal at a later time during said power-up time-interval;

providing first-voltage-threshold-sensitive means responsive to an input of a first threshold level;

connecting an output of said first-voltage-threshold-sensitive means to provide said test-mode signal to said test-circuitry;

connecting an input of said first-voltage-threshold means to receive a voltage difference between said first terminal and said power terminal;

said first-voltage-threshold-sensitive means operating to apply said test-mode signal to said testing-circuitry when said source of operating voltage has risen to said first low voltage;

providing signal-latching means having an input, and having an output operating to apply said test-mode signal to said testing-circuitry;

providing second-voltage-threshold-sensitive means;

connecting an input of said second-voltage-threshold means to receive a voltage difference between said second terminal and said power terminal; and connecting an output of said second-voltage-threshold means to said input of said signal-latching means;

said second-voltage-threshold-sensitive means operating to control said signal-latching means to cause said signal-latching means to apply said test-mode signal to said testing-circuitry upon the occurrence of said second signal, and when said source of operating voltage has risen to said second higher voltage, and said test-mode signal being thereafter maintained independent of said first and second signals received respectively by said first and second terminals.

22. The method of claim 21, including the steps of:

providing an IC-enable input terminal; and connecting said IC-enable input terminal a second input of said signal-latching means;

said IC-enable input operating to terminate said test-mode signal.

23. The method of claim 21 including the steps of:

providing said first voltage-threshold-sensitive means as first transistor means connected between a first circuit-node and said power terminal, second transistor means connected between said first circuit-node and said first terminal, and a first Schmitt trigger having an input connected to said first circuit-node and an output connected to apply a said test-mode signal to said testing-circuitry; and providing said second-voltage-threshold-sensitive means as third transistor means connected between a second circuit-node and said power terminal, fourth transistor means connected between said second circuit-node and said second terminal, a second Schmitt trigger having an input connected to said second circuit-node, and having an output connected to said input of said signal-latching means.

24. The method of claim 23 including the steps of:

providing a logical OR gate to receive as inputs a first test-mode signal generated by said first voltage-sensitive-threshold means, and a second test-mode signal provided by said latching-means; and connecting an output of said logical OR gate to said test-circuitry.

25. The method of claim 24, including the steps of:

providing an IC-enable input terminal, and connecting said IC-enable input terminal a second input of said signal-latching means;

said IC-enable input operating to terminate said test-mode signal.

26. A method for testing an operational-circuit using a test-circuit, wherein said test-circuit is enabled upon receiving a test-mode signal, comprising the steps of:

providing a voltage source of a first polarity, said voltage source having an output voltage that is zero at a beginning of a time-interval, said output voltage progressively increasing during said time-interval, first to a low voltage and then to a high voltage;

providing a first terminal that receives a first signal of an opposite polarity generally coincident with said beginning of said time-interval;

providing a second terminal that receives a second signal of said opposite polarity at a time within said time-interval at which said output voltage of said voltage source is generally equal to said high voltage;

providing first-voltage-threshold-sensitive means;

connecting an output of said first-voltage-threshold-sensitive means to provide said test-mode signal to said test-circuitry;

connecting an input of said first-voltage threshold-sensitive means to receive a voltage difference between said first terminal and said voltage source;

said first-voltage-threshold-sensitive means operating to apply said test-mode signal to said testing-circuit when said output voltage of said voltage source generally equals said low voltage;

providing signal-latching means having an input and an output;

connecting said output of said signal-latching means to said testing-circuit;

providing second-voltage-threshold-sensitive means;

connecting an input of said second-voltage-threshold means to receive a voltage difference between said second terminal and said power supply, and connection an output of said second-voltage-threshold means said input of said signal-latching means;

said second-voltage-threshold-sensitive means operating to control said signal-latching means to cause said signal-latching means to apply said test-mode signal to said testing-circuit upon the occurrence of said second signal.

27. The method of claim 26 including the step of:

connecting said first and second terminals to said operational-circuit to thereby enable use of said first and second terminals after said signal-latching means is controlled to apply said test-mode signal to said testing-circuit.

28. The method of claim 27 including the steps of:

providing an enable input that is operable to terminal said test-mode signal; and connecting said enable input a second input of said signal latching means.

\* \* \* \* \*